United States Patent
He et al.

(10) Patent No.: US 7,691,522 B2
(45) Date of Patent: Apr. 6, 2010

(54) PLATINUM, TITANIUM AND COPPER, MANGANESE AND IRON CONTAINING ELECTROCATALYSTS

(75) Inventors: Ting He, Dublin, OH (US); Eric Rolland Kreidler, Pickerington, OH (US)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/370,991

(22) Filed: Mar. 9, 2006

(65) Prior Publication Data

US 2007/0212590 A1  Sep. 13, 2007

(51) Int. Cl.
*H01M 4/92* (2006.01)
(52) U.S. Cl. .................... 429/40; 420/466; 502/326
(58) Field of Classification Search ............ 429/40, 429/44, 30, 41, 42; 48/198.7, 127.9, 196.7; 502/100, 326, 331; 420/466
See application file for complete search history.

(56) References Cited

U.S. PATENT DOCUMENTS

| | | | |
|---|---|---|---|
| 4,186,110 A | 1/1980 | Jalan et al. | |
| 4,192,907 A | 3/1980 | Jalan et al. | |
| 4,311,569 A | 1/1982 | Dempsey et al. | |
| 4,457,824 A | 7/1984 | Dempsey et al. | |
| 4,513,094 A | 4/1985 | Luczak | |
| 4,528,083 A | 7/1985 | LaConti et al. | |
| 4,707,229 A | 11/1987 | Dempsey et al. | |
| 4,716,087 A | 12/1987 | Ito et al. | |
| 4,781,803 A | 11/1988 | Harris et al. | |
| 4,794,054 A | 12/1988 | Ito et al. | |
| 4,806,515 A | 2/1989 | Luczak et al. | |
| 4,868,073 A | 9/1989 | Hashimoto et al. | |
| 4,970,128 A | 11/1990 | Itoh et al. | |
| 5,013,618 A * | 5/1991 | Luczak ................ 429/44 | |
| 5,024,905 A | 6/1991 | Itoh et al. | |
| 5,068,161 A | 11/1991 | Keck et al. | |

| | | | |
|---|---|---|---|
| 2004/0177556 A1* | 9/2004 | Hagemeyer et al. ........ 48/198.7 |
| 2005/0147867 A1* | 7/2005 | Cooper et al. .............. 429/40 |
| 2007/0037696 A1 | 2/2007 | Gorer et al. | |

FOREIGN PATENT DOCUMENTS

| | | | |
|---|---|---|---|
| EP | 0 129 399 A1 | | 12/1984 |
| EP | 0 355 853 A2 | | 2/1990 |
| EP | 1 526 592 A1 | | 4/2005 |
| GB | 2 242 203 | * | 9/1991 |
| GB | 2242203 A | | 9/1991 |
| JP | 4-18933 | | 1/1992 |
| JP | 6-29027 | | 7/1992 |
| JP | 5-135773 | | 6/1993 |
| JP | 5-217586 | | 8/1993 |
| JP | 6-111828 | | 4/1994 |
| JP | 10-74523 | | 3/1998 |
| JP | 1074523 | | 3/1998 |
| JP | 2005108838 | * | 4/2005 |
| WO | WO 2004/109829 A1 | | 12/2004 |
| WO | WO 2006/021740 A1 | | 3/2006 |

OTHER PUBLICATIONS

Beard, B.C. and Ross, Jr., P. N., "Characterization of a Titanium-Promoted Supported Platinum Electrocatalyst", J. Electrochem. Soc., vol. 133, No. 9, pp. 1839-1845 (Sep. 1986).

* cited by examiner

*Primary Examiner*—Patrick Ryan
*Assistant Examiner*—Monique Wills
(74) *Attorney, Agent, or Firm*—Capitol City TechLaw, PLLC; Mark E. Duell

(57) ABSTRACT

The present teachings are directed toward electrocatalyst compositions of platinum, titanium and at least a third metal for use in fuel cells. The electrocatalyst composition is composed essentially of platinum present in an atomic percentage ranging between about 55 percent and about 95 percent, titanium present in an atomic percentage ranging between about 1 percent and about 30 percent, and at least a third metal present in an atomic percentage ranging between about 1 percent and about 30 percent. The third metal can be at least one member selected from the group consisting of copper, manganese and iron.

17 Claims, No Drawings

PLATINUM, TITANIUM AND COPPER, MANGANESE AND IRON CONTAINING ELECTROCATALYSTS

BACKGROUND

1. Field of the Invention

The present teachings relate to electrocatalyst compositions composed essentially of platinum, titanium and a third metal, with platinum present in an atomic percentage ranging between about 55 percent and about 95 percent, titanium present in an atomic percentage ranging between about 1 percent and about 30 percent, and the third metal present in an atomic percentage ranging between about 1 percent and about 30 percent. The third metal is at least one member selected from the group consisting of manganese and iron.

2. Discussion of the Related Art

The desire to reduce the amount of expensive platinum group metals needed to obtain a desired level of performance for an electrocatalyst is an ever present operational parameter for the design of many devices and procedures involving electrocatalysts.

Enhancement of catalytic performance by combining platinum with various less expensive metals is one of the possible avenues to reduce the amount of platinum required, or increase the efficiency of the catalyzed reaction, or both. One application of interest for Pt-based electrocatalyst is, for instance, the cathode reaction of a typical proton exchange membrane fuel cell ("PEMFC") which can utilize an electrode containing a Pt-based electrocatalyst to catalyze the oxygen reduction reaction.

A need exists for electrocatalyst compositions and thin film fuel cell electrocatalysts that reduce the amount of platinum needed to achieve a desired performance level.

SUMMARY

The present teachings satisfy the need for electrocatalyst compositions with lower platinum amounts, particularly for fuel cell electrocatalysts, and especially for thin film fuel cell electrocatalysts.

An electrocatalyst composition including a metal composition composed essentially of platinum, titanium and a third metal is taught by the present disclosure. The composition can contain platinum present in an atomic percentage ranging between about 55 percent and about 95 percent, titanium present in an atomic percentage ranging between about 1 percent and about 30 percent, and the third metal present in an atomic percentage ranging between about 1 percent and about 30 percent. The third metal is at least one member selected from the group consisting of copper, manganese and iron.

A fuel cell electrocatalyst comprising a composition containing essentially platinum, titanium and a third metal is also taught by the present disclosure. The composition can contain platinum present in an atomic percentage ranging between about 55 percent and about 95 percent, titanium present in an atomic percentage ranging between about 1 percent and about 30 percent, a third metal present in an atomic percentage ranging between about 1 percent and about 30 percent. The third metal is at least one member selected from the group consisting of copper, manganese and iron.

The present teachings further include a fuel cell assembly comprising at least one thin film electrocatalyst, a membrane, and at least one electrode. The thin film electrocatalyst comprises a composition composed essentially of platinum, titanium and a third metal taught by the present disclosure. The composition can contain platinum present in an atomic percentage ranging between about 55 percent and about 95 percent, titanium present in an atomic percentage ranging between about 1 percent and about 30 percent and a third metal present in an atomic percentage ranging between about 1 percent and about 30 percent. The third metal is at least one member selected from the group consisting of copper, manganese and iron. The thin film electrocatalyst can also be a supported electrocatalyst which can comprise a powder composition composed essentially of platinum, titanium and a third metal supported on a high surface area support material. The electrocatalyst can be a supported nanoparticle-containing powder.

DETAILED DESCRIPTION

The present teachings relate to an electrocatalyst composition including a metal composition composed essentially of platinum, titanium and a third metal. The composition can contain platinum present in an atomic percentage ranging between about 55 percent and about 95 percent, titanium present in an atomic percentage ranging between about 1 percent and about 30 percent, and the third metal present in an atomic percentage ranging between about 1 percent and about 30 percent. The third metal is at least one member selected from the group consisting of copper, manganese and iron.

An additional embodiment of the electrocatalyst composition can have platinum present in an atomic percentage ranging between about 55 percent and about 75 percent, titanium present in an atomic percentage ranging between about 10 percent and about 25 percent, and the third metal present in an atomic percentage ranging between about 10 percent and about 25 percent. Yet another example of the electrocatalyst composition can have platinum present in an atomic percentage ranging between about 55 percent and about 90 percent, titanium present in an atomic percentage ranging between about 3 percent and about 25 percent, and copper present in an atomic percentage ranging between about 5 percent and about 25 percent. A further additional embodiment of the electrocatalyst composition can have platinum present in an atomic percentage ranging between about 55 percent and about 70 percent, titanium present in an atomic percentage ranging between about 15 percent and about 20 percent, and copper present in an atomic percentage ranging between about 10 percent and about 25 percent.

Yet another example of the electrocatalyst composition can have platinum present in an atomic percentage ranging between about 55 percent and about 80 percent, titanium present in an atomic percentage ranging between about 10 percent and about 25 percent, and manganese present in an atomic percentage ranging between about 10 percent and about 21 percent. A further additional embodiment of the electrocatalyst composition can have platinum present in an atomic percentage ranging between about 60 percent and about 80 percent, titanium present in an atomic percentage ranging between about 10 percent and about 20 percent, and manganese present in an atomic percentage ranging between about 10 percent and about 16 percent.

Yet another example of the electrocatalyst composition can have platinum present in an atomic percentage ranging between about 60 percent and about 80 percent, titanium present in an atomic percentage ranging between about 9 percent and about 25 percent, and iron present in an atomic percentage ranging between about 7 percent and about 22 percent. A further additional embodiment of the electrocatalyst composition can have platinum present in an atomic percentage ranging between about 60 percent and about 75 percent, titanium present in an atomic percentage ranging between about 10 percent and about 20 percent, and iron present in an atomic percentage ranging between about 14 percent and about 22 percent.

Additional electrocatalyst compositions taught by the present disclosure can have platinum present in an atomic percentage ranging between about 55 percent and about 75 percent, titanium present in an atomic percentage ranging between about 1 percent and about 30 percent, and copper, manganese, or iron as a third metal present at atomic percentages ranging between about 5 percent and about 25 percent.

The electrocatalyst can be a supported nanoparticle-containing powder. The nanoparticles present in the supported powder can range in size from about 0.5 nm to about 100 nm, and can be composed of platinum, titanium, and at least one of copper, manganese or iron.

Also provided by the present teachings is a fuel cell electrocatalyst composed from an electrocatalyst composition, where the composition is composed essentially of platinum present in an atomic percentage ranging between about 55 percent and about 95 percent, titanium present in an atomic percentage ranging between about 1 percent and about 30 percent, and a third metal present in an atomic percentage ranging between about 1 percent and about 30 percent. The third metal is at least one member selected from the group consisting of copper, manganese and iron.

The fuel cell electrocatalyst can be a supported nanoparticle-containing power. The nanoparticles present in the supported powder can range in size from about 0.5 nm to about 100 nm, and can be composed of a composition composed essentially of platinum, titanium, and a third metal. The nanoparticle powder composition can be composed of platinum present in an atomic percentage ranging between about 55 percent and about 95 percent, titanium present in an atomic percentage ranging between about 1 percent and about 30 percent, and the third metal present in an atomic percentage ranging between about 1 percent and about 30 percent. The third metal can be at least one member selected from the group consisting of copper, manganese and iron.

The fuel cell electrocatalyst can be in various forms, including, for example, a thin film, a supported powder, or a supported nanoparticle-containing powder. The nanoparticle-containing fuel cell electrocatalyst can be supported on a support, such as a high surface area carbon, like carbon black, for instance, or can be unsupported. High surface area electrically conductive support material can also be utilized as a support for the fuel cell electrocatalyst.

The fuel cell electrocatalyst can be prepared by, for example, physical vapor deposition. The physical vapor can be plasma generated by a suitable means, for example, plasma guns. Further examples of deposition methods include, for instance, ion plating, ion implantation, evaporation, and laser surface alloying.

The fuel cell electrocatalyst can be prepared by, for example, simultaneous deposition of the platinum metal, the titanium metal and the third metal. Alternatively, the fuel cell electrocatalyst as a thin film can be prepared by sequential deposition of the various metals, or by various combinations of simultaneous and sequential deposition of the various metals present in the electrocatalyst composition.

A fuel cell assembly including a membrane, a thin film, or supported, electrocatalyst, and an electrode which can be different from the thin film electrocatalyst is provided. The thin film, or supported, electrocatalyst can be composed of a composition composed essentially of platinum, titanium, and a third metal. The composition can have platinum present in an atomic percentage ranging between about 55 percent and about 95 percent, titanium present in an atomic percentage ranging between about 1 percent and about 30 percent, and the third metal present in an atomic percentage ranging between about 1 percent and about 30 percent. The third metal can be at least one member selected from the group consisting of copper, manganese and iron.

In additional embodiments of the present fuel cell assembly, the platinum can be present in an atomic percentage ranging between about 55 percent and about 75 percent, titanium in an atomic percentage ranging between about 10 percent and about 25 percent, and the third metal in an atomic percentage ranging between about 10 percent and about 25 percent.

Yet another example of the present fuel cell assembly can have platinum present in an atomic percentage ranging between about 55 percent and about 90 percent, titanium present in an atomic percentage ranging between about 3 percent and about 25 percent, and copper present in an atomic percentage ranging between about 10 percent and about 25 percent. A further additional embodiment of the present fuel cell assembly can have platinum present in an atomic percentage ranging between about 55 percent and about 70 percent, titanium present in an atomic percentage ranging between about 15 percent and about 20 percent, and copper present in an atomic percentage ranging between about 10 percent and about 25 percent.

Yet another example of the present fuel cell assembly can have platinum present in an atomic percentage ranging between about 55 percent and about 80 percent, titanium present in an atomic percentage ranging between about 10 percent and about 25 percent, and manganese present in an atomic percentage ranging between about 10 percent and about 21 percent. A further additional embodiment of the present fuel cell assembly can have platinum present in an atomic percentage ranging between about 60 percent and about 80 percent, titanium present in an atomic percentage ranging between about 10 percent and about 20 percent, and manganese present in an atomic percentage ranging between about 10 percent and about 16 percent.

Yet another example of the present fuel cell assembly can have platinum present in an atomic percentage ranging between about 60 percent and about 80 percent, titanium present in an atomic percentage ranging between about 9 percent and about 25 percent, and iron present in an atomic percentage ranging between about 7 percent and about 22 percent. A further additional embodiment of the present fuel cell assembly can have platinum present in an atomic percentage ranging between about 60 percent and about 75 percent, titanium present in an atomic percentage ranging between about 10 percent and about 20 percent, and iron present in an atomic percentage ranging between about 14 percent and about 22 percent.

Additional fuel cell assemblies taught by the present disclosure can have platinum present in an atomic percentage ranging between about 55 percent and about 75 percent, titanium present in an atomic percentage ranging between about 1 percent and about 30 percent, and copper, manganese, or iron as a third metal present at atomic percentages ranging between about 5 percent and about 25 percent.

The supported electrocatalyst can be composed of a powder composition. The powder composition can be prepared by any suitable preparation method, for instance, wet chemical methods. The powder can be supported on a suitable high surface area support. The high surface area support can be, for instance, carbon or alumina. High surface area refers to supports with surface areas of at least about 100 $m^2/g$.

For all of the compositions taught herein, the concentrations of the metals present therein can be varied to optimize the performance of the electrocatalyst. The composition can be varied dependent on such factors as the operating environment and performance requirements. The composition can, in some embodiments, include platinum present in an atomic percentage ranging between about 55 percent and about 75 percent, or in an atomic percentage ranging between about 60 percent and about 70 percent.

Additionally, the composition can, in some embodiments, include titanium present in an atomic percentage ranging between about 10 percent and about 25 percent, in an atomic percentage ranging between about 10 percent and about 20 percent, in an atomic percentage ranging between about 5 percent and about 30 percent, or in an atomic percentage ranging between about 10 percent and about 30 percent. Furthermore, the composition can, in some embodiments, include copper present in an atomic percentage ranging between about 1 percent and about 25 percent, between about 5 percent and about 25 percent, between about 10 percent and about 20 percent, or between about 1 percent and about 20 percent, or manganese present in an atomic percentage ranging between about 1 percent and about 25 percent, between about 5 percent and about 25 percent, between about 10 percent and about 20 percent, or between about 1 percent and about 20 percent, or iron present in an atomic percentage ranging between about 1 percent and about 25 percent, between about 5 percent and about 25 percent, between about 10 percent and about 20 percent, or between about 1 percent and about 20 percent.

The thin film electrocatalyst can be the cathode of a PEMFC and can drive the oxygen reduction reaction of the PEMFC.

A thin film can be a film ranging in thickness from nanometers to micrometers thick and can be prepared by physical vapor deposition, electrochemical plating, or ink coating of the desired components onto a suitable substrate. One possible means of producing the desired thin film is physical vapor deposition. Physical vapor deposition refers to the deposition of the components from component vapors generated through, for instance, heat, plasma, and electron beams. The deposition of the components, in this case, platinum, titanium and additional metals, can occur simultaneously, or sequentially. A suitable preparation method is described in pending U.S. patent application Ser. No. 10/757,302 filed Jan. 14, 2004.

The metals in the electrocatalyst composition can be present in any of several possible oxidation states and structures. The metal oxidation state and structure depend on a number of factors, including, for example, the chemical formulation, heat treatment, and any exposure to hydrogen and/or oxygen-containing environments. The possible metal structures can include, for example, alloys, mixed oxides, hydrous oxides, mixed hydrides, bronzes, perovskites, and so forth. The structure of any metals on the surface of the electrocatalyst can differ from, or can be the same as, the structure of metals located within the bulk of the electrocatalyst. The concentration of any metals on the surface of the electrocatalyst can differ from, or can be the same as, the concentration of metals located within the bulk of the electrocatalyst.

The metal components of the composition can be present at or on the surface of the electrocatalyst. The metal components, both oxidized and metallic, can be located anywhere in the structure of an electrocatalyst composition according to the present teachings.

The atomic percentages set forth herein were determined by EDX analysis of the thin film electrocatalyst compositions after evaluation by rotating disc electrode as detailed in the Example section below.

All publications, articles, papers, patents, patent publications, and other references cited herein are hereby incorporated herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

The following examples are presented to provide a more complete understanding of the present teachings. The specific techniques, conditions, materials, and reported data set forth to illustrate the principles of the present teachings are exemplary and should not be construed as limiting the scope of the present teachings.

EXAMPLES

Thin film samples of varying platinum, titanium and the additional metals composition were prepared by physical vapor deposition of plasma generated metal vapors. A suitable preparation method is described in pending U.S. patent application Ser. No. 10/757,302 filed Jan. 14, 2004.

The activity levels for the oxygen reduction reaction of the platinum, titanium and the additional metal-containing electrocatalysts were electrochemically screened using a hydrodynamic rotating disc electrode (RDE) apparatus, which is capable of screening numerous material compositions simultaneously. A suitable screening method is described in pending U.S. patent application Ser. No. 10/713,242 filed Nov. 14, 2003.

Thin film samples were coated onto 5 mm diameter glassy carbon electrodes. Following electrochemical cleaning, the samples were then used as the working electrodes in oxygen reduction reaction cells, and the results are presented in Table 1 below.

In Table 1, the atomic percentages of the platinum, titanium and third metal components are tabulated. The shifts of half wave potential ($\Delta E_{1/2}$) in mV are presented, along with the platinum mass-fraction-based activity relative to pure platinum thin film (R-Act) at both 0.7 V and 0.8 V for each sample, in Table 1.

TABLE 1

| COMPOSITION | | | | | RELATIVE ACTIVITY | | |
|---|---|---|---|---|---|---|---|
| Pt (at %) | Ti (at %) | Cu (at %) | Mn (at %) | Fe (at %) | $\Delta E_{1/2}$ (mV) | R-Act (0.7 V) | R-Act (0.8 V) |
| 1.00 | 0.00 | 0.00 | | | 0.0 | 1.0 | 1.0 |
| 0.93 | 0.03 | 0.04 | | | 36.8 | 2.1 | 1.9 |
| 0.91 | 0.03 | 0.06 | | | 47.2 | 2.7 | 2.4 |
| 0.91 | 0.05 | 0.04 | | | 40.4 | 2.2 | 2.2 |
| 0.90 | 0.05 | 0.05 | | | 63.2 | 3.3 | 4.0 |
| 0.85 | 0.03 | 0.12 | | | 68.6 | 3.8 | 3.9 |
| 0.72 | 0.18 | 0.10 | | | 70.9 | 4.2 | 4.2 |
| 0.66 | 0.19 | 0.15 | | | 79.4 | 5.2 | 5.2 |
| 0.65 | 0.25 | 0.10 | | | 44.0 | 3.1 | 2.3 |
| 0.63 | 0.19 | 0.18 | | | 90.7 | 6.5 | 7.0 |
| 0.62 | 0.15 | 0.23 | | | 103.7 | 7.6 | 9.3 |
| 0.60 | 0.25 | 0.15 | | | 34.1 | 2.6 | 1.9 |
| 0.58 | 0.20 | 0.22 | | | 98.0 | 8.4 | 8.8 |
| 0.57 | 0.25 | 0.18 | | | 29.3 | 2.4 | 1.8 |
| 1.00 | 0.00 | | 0.00 | | 0.0 | 1.0 | 1.0 |
| 0.81 | 0.09 | | 0.10 | | 35.5 | 2.0 | 2.1 |
| 0.78 | 0.09 | | 0.14 | | 44.5 | 2.5 | 2.8 |
| 0.77 | 0.13 | | 0.10 | | 56.1 | 2.8 | 3.3 |
| 0.74 | 0.13 | | 0.13 | | 70.5 | 3.2 | 4.5 |
| 0.73 | 0.12 | | 0.15 | | 87.1 | 4.7 | 6.5 |
| 0.73 | 0.11 | | 0.16 | | 97.0 | 6.5 | 8.4 |
| 0.73 | 0.09 | | 0.18 | | −14.7 | 0.6 | 1.0 |

TABLE 1-continued

| COMPOSITION | | | | | RELATIVE ACTIVITY | | |
|---|---|---|---|---|---|---|---|
| Pt (at %) | Ti (at %) | Cu (at %) | Mn (at %) | Fe (at %) | $\Delta E_{1/2}$ (mV) | R-Act (0.7 V) | R-Act (0.8 V) |
| 0.73 | 0.08 | 0.19 | | | 0.9 | 0.6 | 1.0 |
| 0.70 | 0.21 | 0.09 | | | −75.1 | 0.4 | 0.9 |
| 0.69 | 0.18 | 0.13 | | | 62.4 | 3.3 | 3.9 |
| 0.65 | 0.26 | 0.09 | | | 22.1 | 1.9 | 1.5 |
| 0.64 | 0.20 | 0.16 | | | 76.3 | 5.1 | 5.6 |
| 0.62 | 0.25 | 0.13 | | | 22.7 | 2.1 | 1.5 |
| 0.60 | 0.19 | 0.21 | | | 53.2 | 3.5 | 3.4 |
| 0.57 | 0.25 | 0.18 | | | 17.2 | 1.9 | 1.4 |
| 1.00 | 0.00 | | | 0.00 | 0.0 | 1.0 | 1.0 |
| 0.80 | 0.13 | | | 0.07 | 46.1 | 2.7 | 2.5 |
| 0.79 | 0.09 | | | 0.12 | 44.0 | 2.7 | 2.4 |
| 0.76 | 0.13 | | | 0.11 | 63.6 | 3.7 | 3.6 |
| 0.76 | 0.09 | | | 0.15 | 32.6 | 1.9 | 2.4 |
| 0.74 | 0.09 | | | 0.17 | 31.7 | 2.0 | 2.9 |
| 0.73 | 0.12 | | | 0.15 | 76.4 | 4.4 | 4.7 |
| 0.72 | 0.18 | | | 0.10 | 66.8 | 4.2 | 4.0 |
| 0.67 | 0.19 | | | 0.14 | 73.0 | 5.0 | 4.7 |
| 0.66 | 0.25 | | | 0.09 | 55.1 | 3.8 | 3.1 |
| 0.66 | 0.13 | | | 0.21 | 97.4 | 7.9 | 8.3 |
| 0.64 | 0.23 | | | 0.13 | 44.2 | 3.4 | 2.4 |
| 0.63 | 0.19 | | | 0.18 | 80.2 | 6.1 | 5.7 |
| 0.60 | 0.22 | | | 0.18 | 43.4 | 3.5 | 2.4 |
| 0.60 | 0.18 | | | 0.22 | 68.1 | 6.0 | 4.4 |

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

What we claim is:

1. An electrocatalyst composition consisting essentially of:
a metal composition consisting essentially of platinum, titanium and a third metal,
wherein platinum is present in an atomic percentage ranging between about 55 percent and about 95 percent, titanium is present in an atomic percentage ranging between about 1 percent and about 30 percent, and a third metal is present in an atomic percentage ranging between about 1 percent and about 30 percent, and wherein the third metal is at least one member selected from the group consisting of copper and manganese.

2. The electrocatalyst composition according to claim 1, wherein platinum is present in an atomic percentage ranging between about 55 percent and about 75 percent, titanium is present in an atomic percentage ranging between about 10 percent and about 25 percent, and the third metal is present in an atomic percentage ranging between about 10 percent and about 25 percent.

3. The electrocatalyst composition according to claim 1, wherein platinum is present in an atomic percentage ranging between about 55 percent and about 90 percent, titanium is present in an atomic percentage ranging between about 3 percent and about 25 percent, and copper is present in an atomic percentage ranging between about 5 percent and about 25 percent.

4. The electrocatalyst composition according to claim 1, wherein platinum is present in an atomic percentage ranging between about 55 percent and about 70 percent, titanium is present in an atomic percentage ranging between about 15 percent and about 20 percent, and copper is present in an atomic percentage ranging between about 10 percent and about 25 percent.

5. The electrocatalyst composition according to claim 1, wherein platinum is present in an atomic percentage ranging between about 55 percent and about 80 percent, titanium is present in an atomic percentage ranging between about 10 percent and about 25 percent, and manganese is present in an atomic percentage ranging between about 10 percent and about 21 percent.

6. The electrocatalyst composition according to claim 1, wherein platinum is present in an atomic percentage ranging between about 60 percent and about 80 percent, titanium is present in an atomic percentage ranging between about 10 percent and about 20 percent, and manganese is present in an atomic percentage ranging between about 10 percent and about 16 percent.

7. The electrocatalyst composition according to claim 1, wherein the third metal is copper and is present in an atomic percentage ranging between about 10 percent and about 25 percent.

8. The electrocatalyst composition according to claim 1, wherein the third metal is manganese and is present in an atomic percentage ranging between about 10 percent and about 25 percent.

9. A thin film electrocatalyst consisting of the electrocatalyst composition according to claim 1.

10. A fuel cell assembly comprising:
an electrocatalyst,
a membrane, and
an electrode;
wherein the electrocatalyst comprises a composition consisting essentially of platinum, titanium, and a third metal,
wherein platinum is present in an atomic percentage ranging between about 55 percent and about 95 percent, titanium is present in an atomic percentage ranging between about 1 percent and about 30 percent, and the third metal is present in an atomic percentage ranging between about 1 percent and about 30 percent, and
wherein the third metal is at least one member selected from the group consisting of copper and manganese.

11. The fuel cell assembly according to claim 10, wherein platinum is present in an atomic percentage ranging between about 55 percent and about 75 percent, titanium is present in an atomic percentage ranging between about 10 percent and about 25 percent, and the third metal is present in an atomic percentage ranging between about 10 percent and about 25 percent.

12. The fuel cell assembly according to claim 10, wherein platinum is present in an atomic percentage ranging between about 55 percent and about 90 percent, titanium is present in an atomic percentage ranging between about 3 percent and about 25 percent, and copper is present in an atomic percentage ranging between about 5 percent and about 25 percent.

13. The fuel cell assembly according to claim 10, wherein platinum is present in an atomic percentage ranging between about 55 percent and about 70 percent, titanium is present in an atomic percentage ranging between about 15 percent and about 20 percent, and copper is present in an atomic percentage ranging between about 10 percent and about 25 percent.

14. The fuel cell assembly according to claim 10, wherein platinum is present in an atomic percentage ranging between about 55 percent and about 80 percent, titanium is present in an atomic percentage ranging between about 10 percent and about 25 percent, and manganese is present in an atomic percentage ranging between about 10 percent and about 21 percent.

15. The fuel cell assembly according to claim 10, wherein platinum is present in an atomic percentage ranging between about 60 percent and about 80 percent, titanium is present in an atomic percentage ranging between about 10 percent and about 20 percent, and manganese is present in an atomic percentage ranging between about 10 percent and about 16 percent.

16. The fuel cell assembly according to claim 10, wherein the electrocatalyst comprises a thin film electrocatalyst.

17. The fuel cell assembly according to claim 10, wherein the electrocatalyst comprises a supported nanoparticle-containing powder electrocatalyst.

* * * * *